(12) United States Patent
Unagami

(10) Patent No.: US 6,467,671 B1
(45) Date of Patent: Oct. 22, 2002

(54) SOLDER RECOVERING METHOD AND SOLDER RECOVERING APPARATUS

(75) Inventor: Masaki Unagami, Ushiku (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 09/664,382

(22) Filed: Sep. 18, 2000

(30) Foreign Application Priority Data

Sep. 22, 1999 (JP) .......................................... 11-268379

(51) Int. Cl.$^7$ .............................................. B23K 1/018
(52) U.S. Cl. ....................... 228/20.1; 228/40; 228/264
(58) Field of Search .......................... 228/19, 20.1, 21, 228/40, 264; 29/403.4, 825

(56) References Cited

U.S. PATENT DOCUMENTS

| | | | |
|---|---|---|---|
| 3,795,358 A | * | 3/1974 | Sarnacki et al. ................ 134/1 |
| 3,865,298 A | * | 2/1975 | Allen et al. .................... 118/63 |
| 4,619,841 A | * | 10/1986 | Schwerin ..................... 118/56 |

FOREIGN PATENT DOCUMENTS

JP        7-336042        12/1995

* cited by examiner

Primary Examiner—David J. Walczak
Assistant Examiner—Peter deVore
(74) Attorney, Agent, or Firm—Fitzpatrick, Cella, Harper & Scinto

(57) ABSTRACT

A solder receiving method for a printed circuit board having electronic components soldered thereon includes the steps of forming, in a recovering apparatus body, a solder alloy layer, a metal particle layer and a liquid heat medium layer according to differences in specific gravity thereof, and dipping the printed circuit board having the electronic components soldered thereon into the recovering apparatus. An additional step includes spraying, onto the printed circuit having the electronic components soldered thereon, a mixed fluid composed of metal particles and a liquid heat medium, kept at a temperature above the melting point of a solder alloy, to scrape a solder alloy and the electronic components off the printed circuit board, so that it is possible to efficiently recover solder from the printed circuit board having the electronic components soldered thereon.

18 Claims, 1 Drawing Sheet

SOLDER RECOVERING METHOD AND SOLDER RECOVERING APPARATUS

BACKGROUND OF THE INVENTION

1. Field of the Invention

The present invention relates to a solder recovering method and a solder recovering apparatus for separating and recovering a solder alloy and electronic components from a printed circuit board having the electronic components soldered thereon.

2. Description of Related Art

Printed circuit boards having electronic components mounted thereon are incorporated in home electric appliances such as video decks and television sets, or in electronic intelligence instruments such as microcomputers and facsimile machines. These electronic components are mounted on the printed circuit board by bonding with solder. When the home electric appliances or electronic intelligence instruments have gone out of use due to breakdown or superannuation, they are scrapped.

The scrapped home electric appliances and electronic intelligence instruments are collected as incombustible refuses and are usually, without being incinerated, treated as landfills as they are or as shredder dusts after being shredded into pieces. Consequently, once the home electric appliances or electronic intelligence instruments are treated as landfill refuses, the printed circuit boards packaged therein are also brought into landfills.

The solder used for mounting of the electronic components is an alloy of lead and tin. Although lead is stable without dissolving in water near the neutral pH, it has a property of dissolving in acidic water. Therefore, when exposed to acidic rain, lead in the solder alloy on the printed circuit board dissolves, arising a possibility of polluting soil and groundwater. If a person ingests groundwater polluted with lead, the groundwater may cause various health disorders ascribed to lead. However, there are currently no appropriate measures for preventing lead contained in the solder of the scrapped printed circuit board from dissolving out.

In addition, the scrapping by landfill of the home electric appliances or electronic intelligence instruments causes metallic resources to be wasted, because the solder alloys in the printed circuit boards mounted on the home electric appliances or electronic intelligence instruments are never used again.

A method for recovering solder from a printed circuit board is disclosed in Japanese Laid-Open Patent Application No. Hei 7-336042, in which a liquid heat medium, such as an oil kept at a high temperature, is sprayed onto the printed circuit board to melt the solder, and the melted solder is wiped off to recover the solder.

However, in the method described above, since only a liquid such as an oil is sprayed, the mass of the fluid is relatively so small that the solder and electronic components are removed from the printed circuit board with poor efficiency. Besides, since a means for transporting the fluid must be a mechanical one, the construction for recovering solder becomes complicated.

BRIEF SUMMARY OF THE INVENTION

It is an object of the present invention to solve the foregoing problems and to provide a solder recovering method and a solder recovering apparatus for efficiently separating and recovering a solder alloy and electronic components from a printed circuit board.

It is another object of the present invention to provide a solder recovering method and a solder recovering apparatus for separating and recovering a solder alloy and electronic components from a printed circuit board by spraying, onto the printed circuit board having the electronic components soldered thereon, a mixed fluid composed of a liquid heat medium and metal particles and kept at a temperature above the melting point of the solder alloy.

It is a further object of the present invention to provide a solder recovering method and a solder recovering apparatus for easily separating and recovering a solder alloy and electronic components by adjusting the specific gravity of each of the solder alloy, metal particles, liquid heat medium and electronic components.

These and further objects, features and advantages of the present invention will become apparent from the following detailed description of a preferred embodiment thereof taken in conjunction with the accompanying drawing.

DETAILED DESCRIPTION OF THE INVENTION

Figure 1:
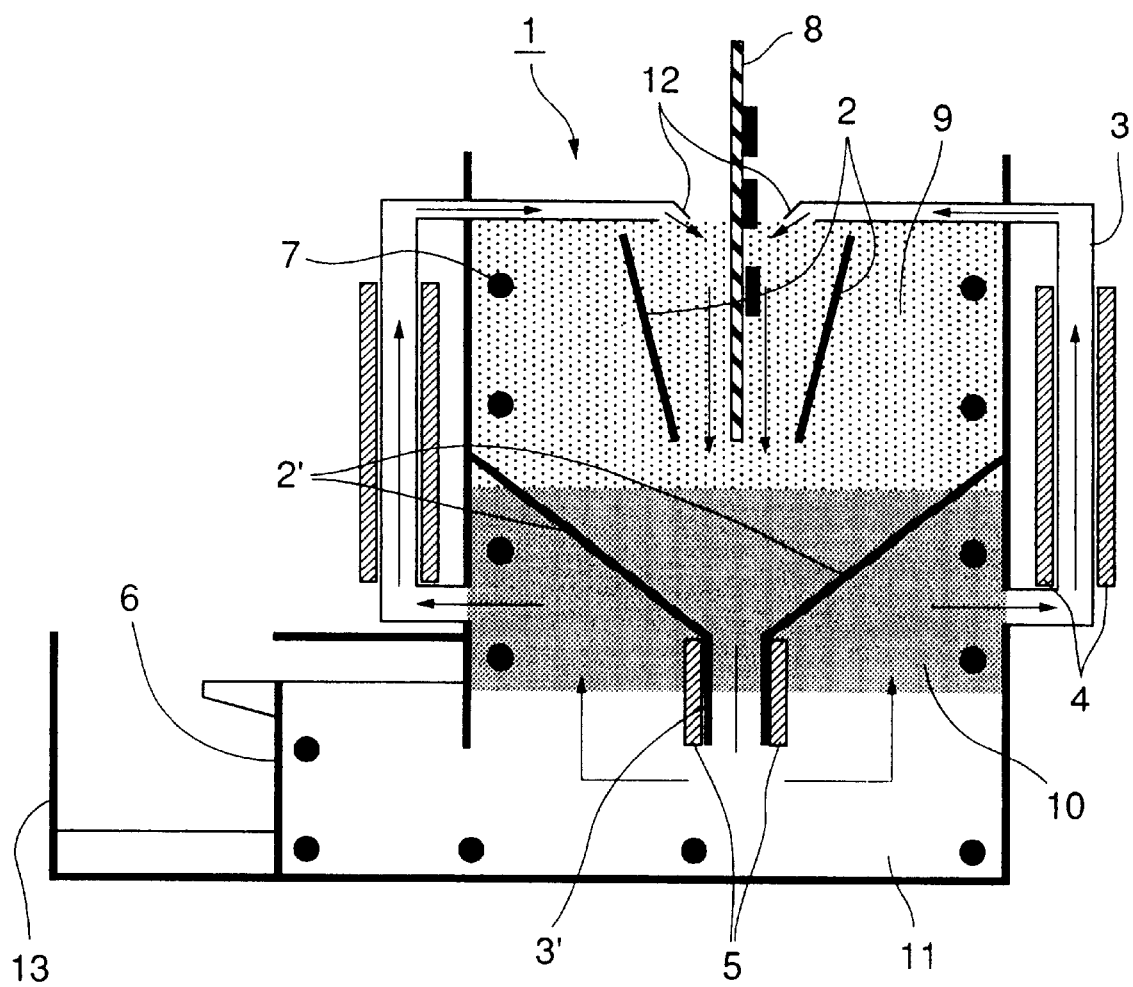
FIG. 1 is a diagram showing in cross section the construction of a solder recovering apparatus according to an embodiment of the present invention.

Hereinafter, a preferred embodiment of the present invention will be described in detail with reference to the drawing.

FIG. 1 is a sectional view of a solder recovering apparatus according to the embodiment of the present invention.

Referring to FIG. 1, when the solder recovering apparatus is in a stationary state, three layers which are spontaneously separated by specific gravity differences are formed in a solder recovering apparatus body 1 of the solder recovering apparatus. Among the three layers, the bottom layer is a solder alloy layer 11 having the largest specific gravity, the intermediate layer is a metal particle layer 10 having the second largest specific gravity, and the top layer is a liquid heat medium layer 9 having the smallest specific gravity.

In the solder recovering apparatus body 1, a plurality of heaters 7 serving as a heating means are mounted on the inner wall surface of the solder recovering apparatus body 1. Nozzles 12 serving as a spray means for spraying a mixed fluid onto a printed circuit board are provided at the upper opening part of the solder recovering apparatus body 1. The nozzles 12 communicate, through transport pipes 3, with side surfaces of the solder recovering apparatus body 1 with which the metal particle layer 10 is kept in contact. For facilitating circulation in the solder recovering apparatus body 1, another transport pipe 3' is provided from the metal particle layer 10 through the solder alloy layer 11. First electromagnetic coils 4 and a second electromagnetic coil 5 are provided at the outer circumference portions of the transport pipes 3 and 3' so as to drive a magnetic mixed fluid.

A plurality of rectifying plates 2 and 2' are disposed in the solder recovering apparatus body 1 so as to control the flow of the mixed fluid while the solder recovering apparatus is operating.

In the first place, the heaters 7 are energized to heat the liquid heat medium, metal particles and solder alloy in the solder recovering apparatus body 1 and to maintain the temperatures of the liquid heat medium, metal particles and solder alloy in the solder recovering apparatus body 1 above the melting point of the solder alloy. The upper limit of the maintained temperature is not particularly restricted, provided that the temperature is lower than the melting point of the metal particles and the liquid heat medium is kept stable. As a result, the solder alloy melts by heating to form the solder alloy layer 11 at the bottom layer and the metal particle layer 10 at the intermediate layer. Since the temperature is maintained to be lower than the melting point of the metal particles, the metal particles remain granular, and the liquid heat medium is distributed among the particles.

When the first electromagnetic coils 4 are energized, the mixed fluid, which is composed of the metal particles (magnetic particles) and the liquid heat medium, is transported from the side surfaces of the solder recovering apparatus body 1 to the nozzles 12 via the transport pipes 3, and is then sprayed from the nozzles 12 at the uppermost part of the solder recovering apparatus body 1. When, at the same time, the second electromagnetic coil 5 is energized, the metal particles are pushed out into the solder alloy layer 11 by electromagnetic inductance. The metal particles pushed out into the solder alloy layer 11 by electromagnetic inductance of the second electromagnetic coil 5 are spontaneously separated from the solder alloy layer 11, and then flow back to the metal particle layer 10.

A printed circuit board 8 having electronic components soldered thereon, which is to be treated, is held with a holding means (not shown), and is dipped between the tow nozzles 12 at the top portion of the solder recovering apparatus body 1. The printed circuit board 8 as dipped is heated with the liquid heat medium, so that the adhered solder is brought into a melted state.

When the mixed fluid sprayed from the nozzles 12 hits the surface of the printed circuit board 8 to permit the metal particles contained in the mixed fluid to collide with the surface of the printed circuit board 8, the melted solder is scraped off together with the electronic components.

The electronic components and the solder alloy as scraped pass between the two rectifying plates 2, and, then, according to the difference of specific gravity, the electronic components float on the surface of the liquid heat medium layer (the top layer) 9, and the solder alloy is precipitated into the metal particle layer (the intermediate layer) 10 together with the metal particles.

The solder alloy precipitated into the metal particle layer (the intermediate layer) 10 is guided into the transport pipe 3', around which the second electromagnetic coil 5 is wound, together with the metal particles, with the rectifying plates 2' protruding from the both sides. Then, the solder alloy is jetted into the solder alloy layer (the lowermost layer) 11 by electromagnetic induction. After that, only the metal particles return to the metal particle layer 10 by spontaneous separation due to the difference of specific gravity, and the recovered solder alloy is transferred to the solder alloy layer 11.

With the above operation continued, the amount of the solder alloy in the lowermost layer increases, and the increased fraction of the solder alloy overflows beyond a partition plate 6 to be discharged into a solder recovery vessel 13. The recovered solder alloy may be used again.

As described above, according to the present invention, since the heat generated from a heat source such as a heater is transferred to the printed circuit board via the mixed fluid composed of the liquid heat medium and metal particles, the solder alloy is efficiently melted because of high heat conductance and heat accumulation of the mixed fluid. Further, since the mixed fluid contains the metal particles in addition to the liquid heat medium, the mass of the fluid to be sprayed is large enough for allowing the melted solder adhered on the printed circuit board to be efficiently scraped. Further, since the solder alloy scraped off the printed circuit board is precipitated in the lowermost layer of the solder recovering apparatus body, while the electronic components float on the uppermost layer thereof, it is possible to make segregated recovery with ease.

While, in the embodiment described above, the metal particles contained in the mixed fluid have, for example, a particle size of about 0.3 mm to 3 mm, or comprise a mixture of particles having different particle sizes within the above range, magnetic metal particles such as iron particles are preferable if the electromagnetic coil is used as the transport means.

Further, the liquid heat medium contained in the mixed fluid is not particularly limited provided that it is chemically stable at a temperature above the melting point of solder (a temperature of 183° C. when the solder has a eutectic composition). For example, the liquid heat medium may be silicone oil or mineral oil.

While, in the embodiment described above, electromagnetic inductance with the electromagnetic coil has been described as a method for transporting the mixed fluid to the nozzles, the method is not necessarily restricted thereto, but a transport means such as, for example, a plunger pump may be used.

While, in the embodiment described above, the printed circuit board is moved in the vertical direction to recover the solder alloy in the solder recovering apparatus body, the printed circuit board may be moved in the horizontal direction to recover the solder alloy.

As has been described above in detail, according to the present invention, a solder alloy and electronic components are efficiently separated and recovered from a printed circuit board having the electronic components soldered thereon, by spraying, onto the printed circuit board, a mixed fluid composed of a liquid heat medium and metal particles and heated at a temperature above the melting point of the solder alloy. Further, the specific gravity of each of the solder alloy, metal particles, liquid heat medium and electronic components is adjusted as follows:

> solder alloy>metal particles>liquid heat medium>electronic components.

Accordingly, the solder alloy scraped off the printed circuit board is precipitated into the lowermost layer of a solder recovering apparatus body because the solder alloy has the largest specific gravity, while the separated electronic components float on the liquid heat medium at the uppermost layer because the electronic components have the smallest specific gravity. Consequently, each of the solder alloy and the electronic components can be easily separated and recovered.

Therefore, according to the present invention, it is possible to prevent environmental pollution since the solder alloy is not disposed as landfills. Besides, it is possible to make the recovered solder alloy usable again for effective utilization of resources.

What is claimed is:

1. A solder recovering method for a printed circuit board having electronic components soldered thereon, comprising the steps of:
   forming, in a recovering apparatus body, a solder alloy layer, a metal particle layer and a liquid heat medium layer according to differences in specific gravity thereof;

dipping the printed circuit board having the electronic components soldered thereon into the recovering apparatus body;

spraying, onto the printed circuit board having the electronic components soldered thereon, a mixed fluid composed of metal particles and a liquid heat medium to scrape a solder alloy and the electronic components off the printed circuit board; and separating the solder alloy and the electronic components as scraped from each other according to a difference in specific gravity thereof.

2. A solder recovering method according to claim 1, wherein the solder alloy, the metal particles, the liquid heat medium and the electronic components have the following relation in specific gravity:

solder alloy>metal particles>liquid heat medium>electronic components.

3. A solder recovering method according to claim 1, wherein, according to the difference in specific gravity, the electronic components as scraped float on the liquid heat medium layer and the solder alloy as scraped is precipitated in the metal particle layer together with the metal particles, and the solder alloy as precipitated is spontaneously separated from the metal particles according to a difference in specific gravity thereof and is transferred into the solder alloy layer.

4. A solder recovering method for a printed circuit board having electronic components soldered thereon, comprising the steps of:

dipping the printed circuit board having the electronic components soldered thereon into a recovering apparatus body containing therein a solder alloy, metal particles and a liquid heat medium;

forming a layer of the solder alloy in the recovering apparatus body, and forming a layer of the metal particles as a mixed fluid in which the liquid heat medium is distributed among the metal particles; and spraying, onto the printed circuit having the electronic components soldered thereon, the mixed fluid composed of the metal particles and the liquid heat medium to scrape a solder alloy on the printed circuit board and the electronic components off the printed circuit board, wherein the electronic components as scraped are transferred to a layer of the liquid heat medium, and the solder alloy as scraped is transferred to the layer of the solder alloy.

5. A solder recovering method according to claim 4, wherein the metal particles are made of a metal smaller in specific gravity than the solder alloy, and the liquid heat medium is a liquid smaller in specific gravity than the metal particles and larger in specific gravity than the electronic components.

6. A solder recovering method according to claim 4, wherein the liquid heat medium is a liquid compound that is chemically stable at a temperature higher than the melting point of the solder alloy.

7. A solder recovering apparatus for a printed circuit board having electronic components soldered thereon, comprising:

an apparatus body capable of forming therein, from a bottom thereof, a solder alloy layer, a metal particle layer and a liquid heat medium layer according to differences in specific gravity thereof;

heating means for heating a solder alloy, metal particles and a liquid heat medium in said apparatus body at a temperature higher than the melting point of the solder alloy and lower than the melting point of the metal particles, wherein said heating means causes the solder alloy layer to be formed as a lower layer and the metal particle layer to be formed as an intermediate layer, and causes the metal particles to be in a mixed fluid state in which the metal particles remain granular and the liquid heat medium is distributed among the metal particles;

transport means for transporting a mixed fluid composed of the metal particles and the liquid heat medium; and spray means for spraying the mixed fluid transported by said transport means, wherein said spray means sprays the mixed fluid onto the printed circuit board when the printed circuit board having the electronic components soldered thereon is dipped in said apparatus body to scrape a solder alloy on the printed circuit board and the electronic components off the printed circuit board, and wherein, according to a difference in specific gravity of the solder alloy and the electronic components as scraped, the electronic components float on the liquid heat medium layer and the solder alloy is transferred to the solder alloy layer.

8. A solder recovering apparatus according to claim 7, wherein the metal particles are magnetic particles including iron particles, and said transport means includes an electromagnetic coil for transporting the mixed fluid composed of the metal particles and the liquid heat medium from the metal particle layer to said spray means by electromagnetic induction.

9. A solder recovering apparatus according to claim 7, wherein solder adhered on the printed circuit board is brought into a melted state according to heating by said heating means when the printed circuit board is dipped in said apparatus body.

10. A solder recovering apparatus according to claim 7, wherein, when the mixed fluid is sprayed onto the printed circuit board, the metal particles contained in the mixed fluid collide with the printed circuit board, so that the solder alloy as melted is scraped off the printed circuit board together with the electronic components.

11. A solder recovering apparatus according to claim 7, further comprising second transport means for pushing out the metal particles to the solder alloy layer to cause the metal particles to circulate in said apparatus body.

12. A solder recovering apparatus according to claim 11, wherein the metal particles are magnetic particles including iron particles, and said second transport means includes an electromagnetic coil for transporting the metal particles to the solder alloy layer by electromagnetic induction.

13. A solder recovering apparatus according to claim 7, wherein the solder alloy, the metal particles, the liquid heat medium and the electronic components have the following relation in specific gravity:

solder alloy>metal particles>liquid heat medium>electronic components.

14. A solder recovering apparatus according to claim 13, wherein the metal particles pushed out to the solder alloy layer by said second transport means are spontaneously separated from the solder alloy layer and flow back to the metal particle layer.

15. A solder recovering apparatus for a printed circuit board having electronic components soldered thereon, comprising:

a recovering apparatus body containing therein a solder alloy, metal particles and a liquid heat medium;

means for forming a layer of the solder alloy in said recovering apparatus body, and for forming a layer of the metal particles as a mixed fluid in which the liquid heat medium is distributed among the metal particles; and spray means for spraying a mixed fluid composed of the metal particles and the liquid heat medium, wherein said spray means sprays the mixed fluid onto the printed circuit board when the printed circuit board having the electronic components soldered thereon is dipped in said recovering apparatus body to scrape a solder alloy on the printed circuit board and the electronic components off the printed circuit board, and wherein, according to a difference in specific gravity of the solder alloy and the electronic components as scraped, the electronic components float on the surface of said recovering apparatus body and the solder alloy is transferred to the layer of the solder alloy.

16. A solder recovering apparatus according to claim 15, wherein the liquid heat medium is a liquid compound that is chemically stable at a temperature above the melting point of the solder alloy.

17. A solder recovering apparatus according to claim 15, wherein the metal particles are magnetic particles including iron particles.

18. A solder recovering method for a printed circuit board having electronic components soldered thereon, comprising the steps of:

forming in an apparatus body, from a bottom thereof, a solder alloy layer, a metal particle layer and a liquid heat medium layer according to differences in specific gravity thereof;

heating a solder alloy, metal particles and a liquid heat medium in the apparatus body at a temperature higher than the melting point of the solder alloy and lower than the melting point of the metal particles;

forming the solder alloy layer as a bottom layer and forming the metal particle layer as an intermediate layer according to heating, and causing the metal particles to be in a mixed fluid state in which the liquid heat medium is distributed among the metal particles; and spraying a mixed fluid composed of the metal particles and the liquid heat medium onto the printed circuit board having the electronic components soldered thereon, dipped in the apparatus body, to scrape a solder alloy on the printed circuit board and the electronic components off the printed circuit board, wherein, according to a difference in specific gravity of the solder alloy and the electronic components as scraped, the electronic components float on the liquid heat medium layer and the solder alloy is transferred to the solder alloy layer.

* * * * *